United States Patent [19]

Miyakawa

[11] Patent Number: 5,278,449
[45] Date of Patent: Jan. 11, 1994

[54] SEMICONDUCTOR MEMORY DEVICE

[75] Inventor: Kuniko Miyakawa, Tokyo, Japan

[73] Assignee: Nec Corporation, Tokyo, Japan

[21] Appl. No.: 937,419

[22] Filed: Aug. 31, 1992

Related U.S. Application Data

[62] Division of Ser. No. 798,960, Nov. 27, 1991.

[30] Foreign Application Priority Data

Nov. 28, 1990 [JP] Japan .................................. 2-328346
Nov. 28, 1990 [JP] Japan .................................. 2-328348

[51] Int. Cl.$^5$ ................... H01L 232/48; H01L 29/46; H01L 29/52; H01L 29/64
[52] U.S. Cl. .................................. 257/751; 257/771; 257/765; 257/750
[58] Field of Search ................... 357/67, 71; 437/194, 437/225; 257/751, 771, 765, 750

[56] References Cited

U.S. PATENT DOCUMENTS

| 3,382,568 | 5/1968 | Kuiper | 29/578 |
| 3,501,829 | 3/1970 | Corwin | 29/577 |
| 3,740,835 | 6/1973 | Duncan | 29/578 |
| 3,902,936 | 9/1975 | Price | 156/3 |
| 4,538,344 | 9/1985 | Okumura et al. | 29/589 |

FOREIGN PATENT DOCUMENTS 54-41871 12/1979 Japan.

OTHER PUBLICATIONS

Planarized Aluminum Metallization for Sub-0.5 μm CMOS Technology, 1990 IEEE, IEDM 90, pp. 51-54, by F. S. Chen, et al.

Primary Examiner—Jerome Jackson
Assistant Examiner—T. M. Arroyo
Attorney, Agent, or Firm—Burns, Doane, Swecker & Mathis

[57] ABSTRACT

In this semiconductor device, contact holes extending from a lower interconnection layer containing diffusion layers at the surface of a Si substrate to an Al-involved interconnection layer formed above the Sis substrate through the intermediation of an interlayer dielectric film are filled with Al alloy having a eutectic point lower than that of Al-Si alloy. Then, for example, an Al-Ge alloy is sputtered, reflowed and allowed to react with the Si film to convert into an Al-Ge-Si alloy. At the stage of forming the Al-Ge-Si alloy, the reflow ceases. This brings the reduction of junction leakage current from the diffusion layers. Similarly in the case of a high aspect ratio of contact hole, this technique enables the contact hole to be fully filled with the above-mentioned Al alloy. Besides this technique enables direct interconnections in multilayer Al-involved interconnection structure of between an upper-layer Al-involved interconnection and diffusion layers, contributing to reduction of area required for interconnections.

7 Claims, 12 Drawing Sheets

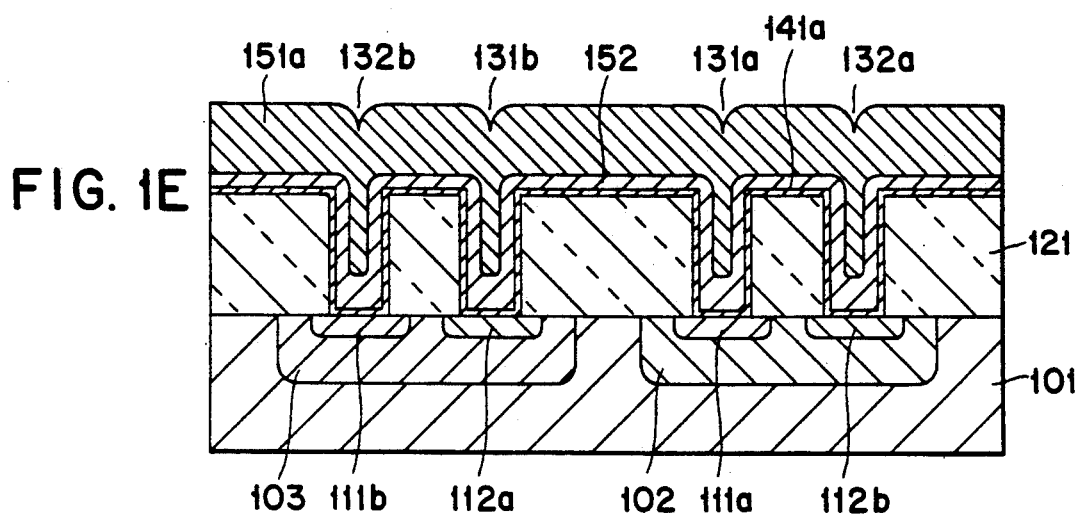
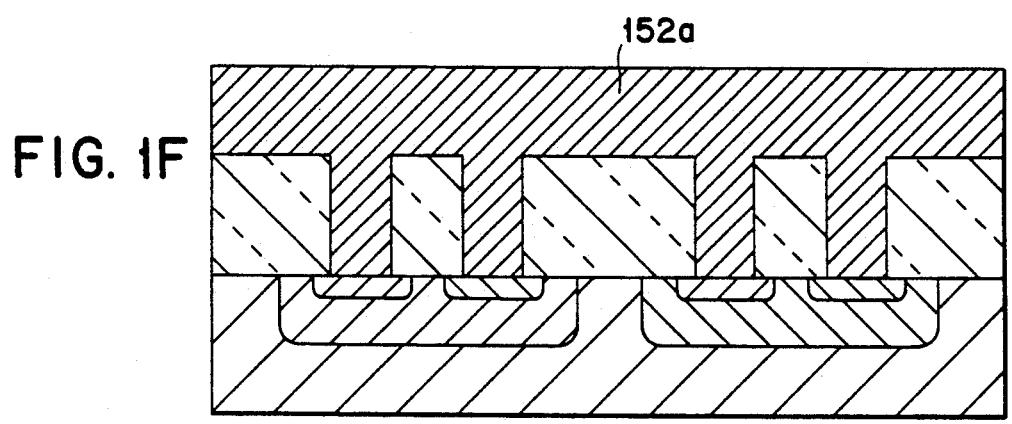
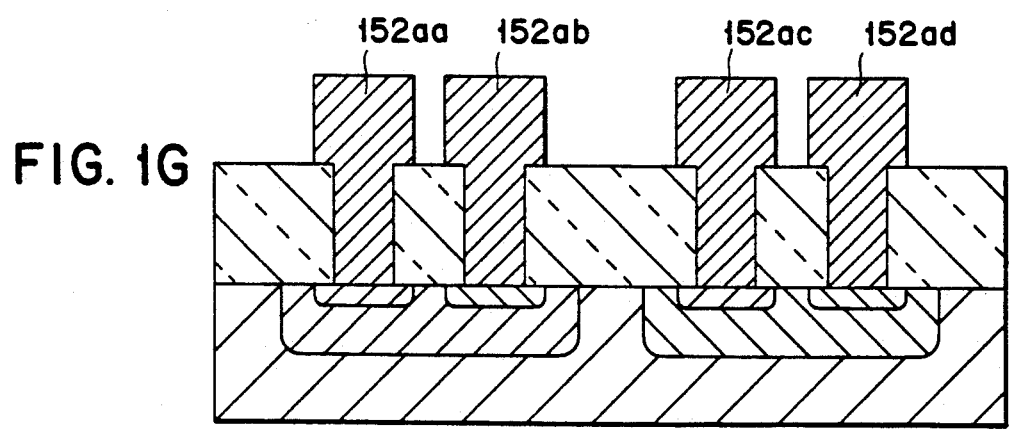

SEMICONDUCTOR MEMORY DEVICE

BACKGROUND OF THE INVENTION

This application is a division of prior application Ser. No. 07/798,960, filed Nov. 27, 1991.

This invention relates to a semiconductor device and a process of fabricating the same. It relates more particularly to a conductor layer filling a contact hole of the semiconductor device so as to make electrical connection between the upper interconnection layer and the lower interconnection layer including diffusion layers formed at the surface, and a process for making the conductor layer.

DESCRIPTION OF THE PRIOR ART

A semiconductor device comprising a Si substrate and MOS transistors thereon is constructed of diffusion layers at the surface of the Si substrate, a non-Al interconnection layer consisting of polycrystalline silicon, silicide, polycide and high melting point metal, etc. on the surface of the Si substrate, and an Al-involved interconnection layer above the Si substrate through an interlayer dielectric film, these being electrically interconnected. Electrical connections between the Al-involved interconnection layer and the diffusion layers and between the Al-involved interconnection layer and the non-Al-involved interconnection layers are made by cutting contact holes in the interlayer dielectric film and filling these holes with a conductor. Likewise in the case of the so-called multilayer interconnection consisting of a plurality of Al-involved interconnection layers, contact holes (called through holes, as well) are cut in the interlayer dielectric film formed between the upper Al-involved interconnection layer and lower Al-involved interconnection layer and filled with conductor layer to make the electrical connection.

In the age of several $\mu$m thick p-n junctions for the diffusion layer, a conductor layer filling a conductor hole and Al-involved interconnection layer were made of pure Al. With shallower p-n junction associated with higher integration level, heat treatment (alloying treatment) for making ohmic contact between Si of the diffusion layer and Al of conductor layer has become to tend to be accompanied by the abnormal diffusion of Al into Si substrate (called alloy spike, too), resulting in breakage of p-n junction. It is possible to cope with this phenomenon by previously causing Al to contain Si. For this reason, Al alloys containing at least Si has become used as component of conductor layer filling contact holes and Al-involved interconnection layers.

A process of fabricating such a semiconductor device comprises forming an interlayer dielectric film on a Si substrate containing previously-formed diffusion layer thereat, etc., cutting contact holes extending to the diffusion layer, or the like, forming Al alloy (Al-Si or Al-Si-Cu) film by sputtering, patterning this Al alloy film by etching, simultaneously forming conductor layers filling the contact holes and Al-involved interconnection layer, and for example, carrying out the alloying treatment in hydrogen atmosphere. Another process, as disclosed in Japanese Published Patent Specification No. Sho. 54-41871 (Dec. 11, 1979), involved forming an interlayer dielectric film on a Si substrate containing diffusion layers, etc. previously formed thereat, forming contact holes extending to the diffusion layers, etc. forming Si film over the whole surface and besides Al film thereover, patterning the resulting laminated layer of Si and Al films by etching, and alloying treatment before and after the patterning step. In the two fabrication processes, the conductor layer filling the contact holes and the Al-involved interconnection layer are simultaneously formed using the same material.

As the diameter of the contact hole becomes smaller, and in turn the aspect ratio of the contact hole becomes greater (ratio of diameter to depth of contact hole), with further higher integration level of the semiconductor device, however, other disadvantageous phenomena have become visualized. In other words, such contact holes may be stoppered at the upper end with Al alloy film when formed, so that it becomes difficult to sufficiently fill the contact holes with Al alloy, resulting in increased contact resistance. In the case of a multilayer interconnection construction, the increase in the aspect ratio of the contact hole produces further serious problem, that is, because the aspect ratio of the contact hole extending to the diffusion layer from the upper Al-involved interconnection layer is higher than that reaching from the lower Al-involved interconnection layer, it becomes difficult to directly connect between the Al-involved interconnection layer and diffusion layers, and therefore it becomes needed to provide an intermediate connection, which in turn results in an increased area necessary for the connection between the upper Al-involved interconnection layer and the diffusion layer.

As technique for filing a contact hole having a higher aspect ratio with conductor layer are proposed one that forms a non-Al conductor layer of Si or W by selective growth, and another that make Al alloy flowable by heating.

The process by selective growth of non-Al conductor layer is satisfactory in the respect to fully filling the contact hole with conductor layer. Besides it can be used for connection between the upper and lower Al-involved interconnection layers. Particularly there is advantage that the upper Al-involved interconnection layer and the diffusion layer are directly connected. The use of Si results in higher resistivity and hence higher contact resistance than Al alloy. In the case of W, its resistivity is lower than Si and higher than Al alloy. Particularly the contact resistance to p+-diffusion layer becomes higher than explained, and remarkably varies. In the contrary the alloying treatment for making connection between W at the upper end of the contact hole and Al-involved interconnection layer connecting it causes silicide reaction and mutual substitution reaction between Si and W of the diffusion layer with the result of increasing p-n junction leakage current.

The method of making Al alloy flowable by heating and filling contact holes with it will be described, for example, by reference to a paper: F. S. Chen, et al., Tech. Digest of IEDM, pp. 51–54, 1990: While keeping at about 500° C. a Si substrate covered over its surface with an interlayer dielectric film provided with contact holes, Al-Si-Cu alloy film is formed on the Si substrate by sputtering. In this case, the Si substrate is heated and hence the Al-Si-Cu alloy film is flowable simultaneously with being formed. For this, the higher maintenance temperature of the Si substrate (substrate temperature) the better. Higher substrate temperature however gives a result that cohesive power of Al-Si-Cu alloy is superior to adhesive power between sputtered Al-Si-Cu alloy and the interlayer dielectric film of the interlayer film underneath it. This results in stoppage at the upper end of the contact hole with the becoming-flowable Al-Si-Cu alloy film, and in turn it becomes difficult to fill the contact hole with the Al-Si-Cu alloy. This tendency becomes more remarkable with decreasing diameter of the contact hole. Particularly for multilayer Al-involved interconnection construction, this technique can be applied only to the interconnection of the lowermost layer Al but because of being impossible to make flowable the lower Al-involved interconnecting layers, cannot be applied to the second or following interconnection layers.

BRIEF SUMMARY OF THE INVENTION

Object of the Invention

It is an object of the invention to provide a semiconductor device, particularly a Si semiconductor device, of a construction permitting to make electrical connection with a reduced contact resistance between an Al-involved interconnection layer and the lower interconnection layer.

Another object of the invention is to provide a semiconductor device of an construction permitting to make electrical connection with a reduced contact resistance between a diffusion layer at the surface of the Si substrate and an Al-involved interconnection layer above the Si substrate through an interlayer dielectric layer and to minimize leakage current through the p-n junctions bordering the diffusion regions.

A further object of the invention is to provide a semiconductor device of a multilayer Al-interconnections structure permitting to make direct electrical connection between a diffusion layer at the surface of a Si substrate and an Al-involved interconnection layer above the Si substrate through an interlayer dielectric film without intermediate of any under Al-involved interconnection layer, and thus to minimize the area required for the connection.

A further object of the invention is to provide a process of fabricating a semiconductor device, particularly Si semiconductor device of the construction permitting to make electrical connection with a reduced contact resistance between an Al-involved interconnection layer and the lower interconnection layer.

A further object of the invention is to provide a process of fabricating the semiconductor device of the construction permitting to make electrical connection with a reduced contact resistance between the diffusion layer at the surface of the Si substrate and an Al-involved interconnection layer above the Si substrate through an interlayer dielectric layer and to minimize leakage current through the p-n junctions bordering the diffusion regions.

A further object of the invention is to provide a semiconductor device of a multilayer Al-interconnections structure permitting to make direct electrical connection between a diffusion layer at the surface of a Si substrate and an Al-involved interconnection layer above the Si substrate through an interlayer dielectric film without intermediation of any under Al-involved interconnection layer, and thus to minimize the area required for the connection.

A further object of the invention is to provide a process of fabricating a semiconductor device, particularly Si semiconductor device, comprising simultaneously cutting different types contact holes extending to different types of lower interconnection layers, and simultaneously filling these contact holes with conductor film.

Summary of the Invention

A semiconductor device according to the present invention comprises at least a lower interconnection layer containing diffusion layers formed at the surface of a Si substrate, an upper interconnection layer formed above said Si substrate through intermediation of an interlayer dielectric layer, contact holes extending from said upper interconnection layer, contact holes extending from said upper interconnection layer to said lower interconnection layer, and conductor layers filling said contact holes, and conducting layers filling the contact holes, the upper interconnection layer consisting of an Al-involved interconnection layer, the conductor layer is made of an Al alloy having an eutectic point lower than the eutectic point of Al-Si alloy.

The Al alloy of which the conductor layer is made preferably contains at least Ge and Si. The Al-involved connection layer is preferably made of the Al alloy constituting the conductor layer when the top faces of the interlayer dielectric film is substantially flat, an Al alloy having an eutectic point higher than the eutectic point of the Al alloy constituting the conductor layer, or an Al alloy having an eutectic point higher than the eutectic point of the Al alloy constituting the conductor layer when the top faces of the interlayer dielectric film where the upper ends of the contact holes are located are rough. A conducting barrier film is preferably provided at least on the top face of the lower interconnection layer exposed at the lower end of each contact hole. A conducting barrier film is preferably provided on each side face of an interlayer dielectric film exposed as the result of formation of the contact hole. When there are two or more Al-involved interconnection layers, a conducting barrier film is preferably provided at least on each top face of the non-Al-involved interconnection layer containing diffusion layers.

A process of fabricating a semiconductor device according to the present invention comprises step of forming a lower interconnection layer containing at least diffusion layers provided at the surface of a Si substrate; step of in sequence forming an interlayer dielectric film over the whole surface, forming a photoresist film over the whole surface, and etching back the whole surface to substantially planarize the top face of the interlayer dielectric film; step of forming contact holes extending to the lower interconnection layer in the interlayer dielectric film; step of forming a Si film over the whole surfaces including the side faces of the interlayer dielectric film exposed as the result of the formation of contact holes and the top faces of the lower interconnection layer exposed as the result of the formation of contact holes; step of sputtering a first Al alloy containing at least Ge on the surface of the Si film, the first Al alloy spreading on the surface of the Si film to form the first Al alloy film covering thereover, and forming a second Al alloy film containing at least Ge and Si on the whole surface including the insides of the contact holes by the alloying reaction between the first Al alloy film and the Si film; and step of etching to leave the second Al alloy film in the insides of the contact holes and to form an Al-involved interconnection layer of the second Al alloy film, or after leaving the second Al alloy film only in the insides of the contact holes, forming a third Al alloy film having an eutectic point higher than that of the second alloy film and etching to pattern the third Al alloy film and thus form an Al-involved interconnection layer. It preferably comprises step of previously forming a conducting barrier film on each top face of the lower interconnection layer or, after forming contact holes, forming a conducting barrier over the whole surface before forming the Si film.

In the case of a multilayer Al-involved interconnection structure, it preferably comprises, after performing the steps until formation of the lower Al-involved Al-involved interconnection layer in the way described above, further step of forming an additional interlayer dielectric film and substantially planarizing the top face of the additional interlayer dielectric film; step of simultaneously cutting additional contact holes of different types extending to the lower interconnection layer and the lower Al-involved interconnection layer in these interlayer dielectric films; step of forming an additional Si film over the whole surfaces including these side faces of the interlayer dielectric films exposed as the result of formation of the additional contact holes, and the top faces of the lower interconnection layer and the lower Al-involved interconnection layer exposed as the result of the formation of contact holes; step of additionally spattering the first Al alloy on the surfaces of the additional Si film, the additional first Al alloy spreading on the surface of the additional Si film to form the additional first Al alloy film covering thereover, and alloying reaction occurring between the additional first step Al alloy film and the Si film, thus forming the additional second Al alloy film over the whole surface including the insides of the additional contact holes; and step of etching to leave the additional second Al alloy film in the insides of the additional contact holes and to form an further-upper Al-involved interconnection layer of the additional second Al alloy film, or step of etching, after leaving the additional second Al alloy film only in the insides of the additional contact holes, and forming an additional third Al alloy film on the whole surface, to pattern the additional third Al alloy film and thus form an Al-involved interconnection layer. It preferably comprises step of previously forming a conducting barrier on each top face of the lower interconnection layer.

Another process of fabricating a semiconductor device according to the present invention comprises step of forming a lower interconnection layer containing at least diffusion layers provided at the surface of a Si substrate;

step of forming an interlayer dielectric film over the whole surface;

step of forming contact holes extending to the lower interconnection layer in the interlayer dielectric film;

step of forming Si film over the whole surfaces including the side faces of the interlayer dielectric film exposed as the result of the formation of contact holes and the top faces of the lower interconnection layer exposed as the result of the formation of contact holes;

step of sputtering a first Al alloy containing at least Ge on the surface of the Si film; the first Al alloy spreading on the surface of the Si film to form the first Al alloy film covering thereover, and forming a second Al alloy film containing at least Ge and Si on the whole surface including the insides of the contact holes by the alloying reaction between the first Al alloy film and the Si film; and step of etching to leave the second Al alloy film only in the insides of the contact holes; and step of forming over the whole surface a third Al alloy film having an eutectic point higher than that of the second Al alloy film and patterning the third Al alloy film to form an Al-involved interconnection layer. It preferably comprises step of previously forming a conducting barrier film on each top face of the lower interconnection layer or, after forming contact holes, forming a conducting barrier over the whole surface before forming the Si film.

In the case of a multilayer Al-involved interconnection structure, it preferably comprises, after performing the steps until formation of the lower Al-involved Al-involved interconnection layer in the way described above, further step of forming an additional interlayer dielectric film and simultaneously cutting additional contact holes of different types extending to the lower interconnection layer and the lower Al-involved interconnection layer in these interlayer dielectric films; step of forming an additional Si film over the whole surfaces including these side faces of the interlayer dielectric films exposed as the result of formation of the additional contact holes, and the top faces of the lower interconnection layer and the lower Al-involved interconnection layer exposed as the result of the formation of contact holes; step of additionally spattering the first Al alloy on the surface of the additional Si film, the additional first Al alloy spreading on the surface of the additional Si film to form the additional first Al alloy film covering thereover, and alloying reaction occurring between the additional first Al alloy film and the Si film, thus forming the additional second Al alloy film over the whole surface including the insides of the additional contact holes; step of etching to leave the additional second Al alloy film in the insides of the additional contact holes and to form an further-upper Al-involved interconnection layer of the additional second Al alloy film, and step of forming over the whole surface, and patterning, the additional third Al alloy film to form the upper Al-involved interconnection layer. It preferably comprises step of previously forming a conducting barrier on each top face of the lower interconnection layer.

In the semiconductor device according to the present invention, the conductor layer filling contact holes is made of Al alloy having a low resistivity, which enables reduction of contact resistance. Contact holes extending to diffusion layers are filled with Al alloy having an eutectic point lower than that of Al-Si alloy, and hence abnormal diffusion of Al from conductor layer to diffusion layers is suppressed, and in turn contact resistance is reduced in electrical connection between the diffusion layer on the surface of the Si substrate an the Al-involved interconnection layer formed on the Si substrate through the intermediation of the interlayer dielectric film, and p-n junction leakage current is reduced. Besides direct electrical connection between a diffusion layer formed at the surface of the Si substrate and an upper-layer Al-involved interconnection above the Si substrate through the intermediation of the interlayer dielectric layer is possible without intermediate connection to the lower Al-involved interconnection layer, and this enables reduction of area required for interconnections.

In the process for fabricating a semiconductor device according to the present invention, the formation of conductor layer filling contact holes is carried out by sequentially forming contact holes in the interlayer dielectric film, forming a Si film, spattering a first Al alloy containing at least Ge, the spattered first Al alloy spreading over the Si film and thus the first Al alloy film being formed, and forming the second Al alloy film containing at least Ge and Si by the alloying reaction between the first Al alloy film and Si film.

At the time point of spattering the first Al alloy, the Si film that is the underlying film has a good wettability to the first Al alloy. Owing to this, the first Al alloy film formed by sputtering is not island-like film but a film covering the entire surface of the Si film. Besides the eutectic point of the first Al alloy film is lower than that of Al-Si alloy, this ensures the reflow of the first Al alloy film at lower temperatures than that of AL-Si alloy. If reflowed, the first Al alloy film makes the wettability of the underlying film higher, and consequently spreads over the entire surface and becomes easy to flows into high aspect ratio contact holes. The reflowed first Al alloy film is allowed to react with the underlying Si film to alloy into the second Al alloy film. The eutectic point of the second Al alloy film is higher than that of the first Al alloy film and lower than that of Al-Si alloy. By utilizing this difference in eutectic point, it is possible to prevent the second Al alloy film obtained by the alloying reaction from reflowing.

From the above description, the process for fabricating a semiconductor device according to the present invention enables reduction of contact resistance involved in the electrical connection between the Al-involved interconnection layer and the lower interconnection layer of the Si semiconductor device. It enables decease of contact resistance involved in the electrical connection between a diffusion layer at the surface of the Si substrate and the Al-involved interconnection layer above the Si substrate through the intermediation of an interlayer dielectric film, and reduction of the p-n junction leakage current. It enables direct electric connection between a diffusion layer at the surface of the Si substrate and the Al-involved interconnection layer above the Si substrate through the intermediation of an interlayer dielectric film without intermediate connection to the lower Al-involved interconnection layer, contributing to reduction of area required for the interconnection. Besides it enables simultaneous formation of different types of contact holes extending to different types of lower interconnection in the interlayer dielectric film, and simultaneously filling of conductor into these contact holes.

BRIEF DESCRIPTION OF THE DRAWINGS

The above-mentioned and other objects, features and advantage of this invention will become more apparent by reference to the following detailed description of the invention taken in conjunction with the accompanying drawings, wherein:

FIGS. 1A to 1G are fragmentary sectional views showing in sequence the process steps for illustrating the first embodiment of the present invention;

DETAILED DESCRIPTION OF PREFERRED EMBODIMENTS

Figure 1A:
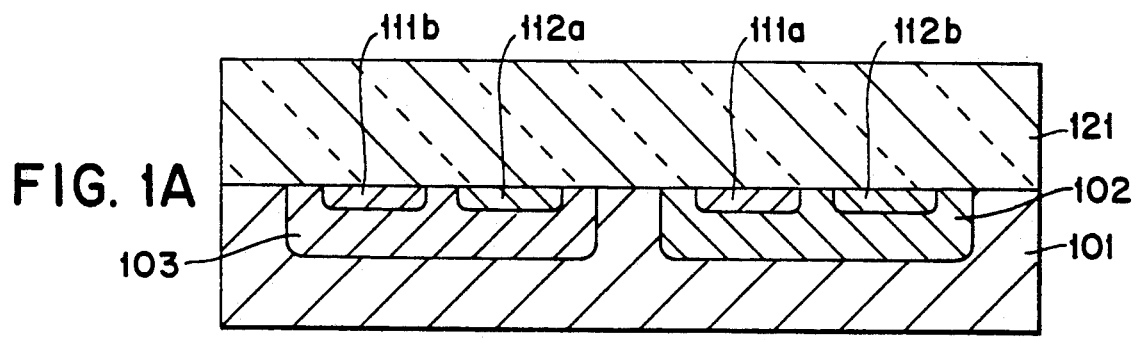

The present invention will be described with reference to the drawings hereinafter:

Referring to FIGS. 1A to 1G which are fragmentary sections showing in sequence the process steps, the basic construction of the present invention will be made apparent by illustrating the fabrication process. In the first embodiment of the present invention, first a n-well 102 and a p-well 103 are formed at the surface of a p-type Si substrate 101 so as to produce an about 2 μm deep junctions. p+-diffusion layer 111a and n+-diffusion layer 112b are formed at the surface of n-well 102. n+-diffusion layer 112a and p+-diffusion layer 111b are formed at the surface of p-well 103. p+-diffusion layers 111a, 111b and n+-diffusion layer 112a, 112b are of about 0.1 μm deep junction. The junction breakdown voltage of the p°-diffusion layer 111a is −15 V or lower an the junction breakdown voltage of the n+-diffusion layer 112a is +15 V or higher. Then over the whole surface an interlayer film 121 of $SiO_2$ having an about 1 μm in thickness is deposited by the CVD technique. The top face of the interlayer dielectric film 121 is substantially flat. (FIG. 1A).

Figure 1B:
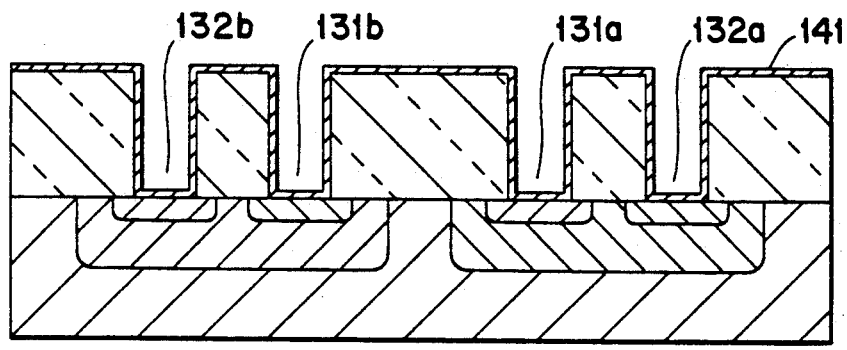

In the next process step, contact holes: 131a extending to p+-diffusion layer 111a, 131b extending to n+-b 112a, 132a extending to n+-diffusion layer 112b, and 132b extending to p+-diffusion layer 111b are formed in the interlayer film 121. These contact holes are of 0.5 to 3.0 μm in diameter and 0.33 to 2.0 in aspect ratio. Then on the resultant whole surface including the surfaces of p+-diffusion layers 111a, 111b, the surfaces of n+-diffusion layers 112a, 112b exposed at the bottoms of the contact holes, and the inside surfaces of the contact holes, a Si film 141 of 5 to 50 nm thick is formed by sputtering. The thickness of this Si film 141 is set on the basis of the thickness of the Al-Ge alloy film formed in the succeeding step and the temperature at which the Si substrate 101 is be kept for forming the alloy film. Si film 141. The Si film may be of polycrystalline film or noncrystalline film (FIG. 1B). There are techniques for forming Si film 141 as of CVD, resistor heating, and electron beam heating, for which it is needed to remove natural-oxidation film formed on the surface of Si film 141.

Figure 1C:
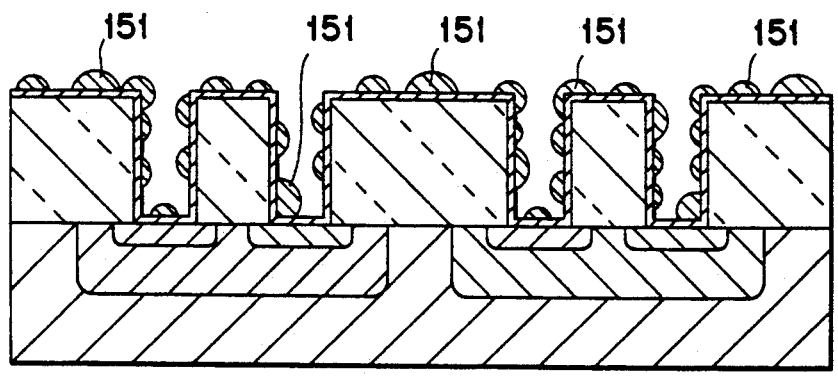
Figure 1D:
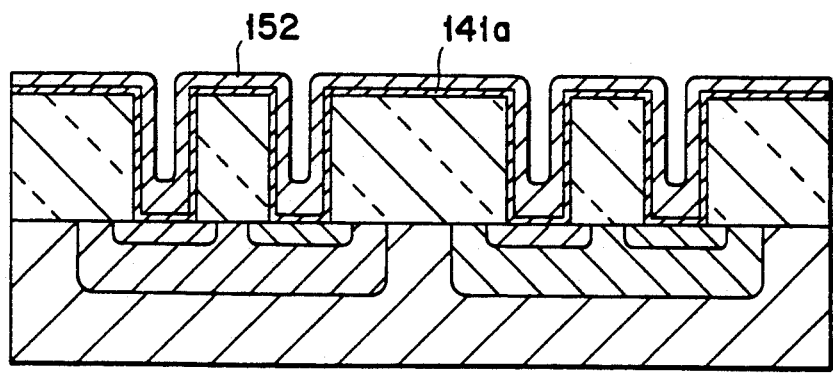

In the next step, at a temperature of Si substrate 101 to be kept (substrate temperature) set to 250° to 400° C., an Al-Ge alloy film containing Ge in 5% by weight is formed on the whole surface by sputtering. The sputtering power is 0.9 to 7.0 kW. At very initial stage, island-like Al-Ge alloy films 151 are formed scatteringly on the surface of Si film 141, as shown in FIG. 1C. Al-Ge alloy however has a low eutectic point of 424° C., and when in contact with the underlying Si film 141, owing to the good wettability, the island-like Al-Ge alloy films 151 spreads over the surface of the Si-film, as dependent on the set substrate temperature value, and solidifies. (This series of phenomena is referred to as reflow hereinafter). Thus the whole surface of Si film 141 becomes coated with Al-Ge film 151. Notably the resulting film is thicker on the insides of contact holes 131a, 131b, 132a, 132b as if it had flowed into them. The reflowed Al-Ge alloy film is allowed to react with the underlying Si film 141 to form an Al-Ge-Si alloy film 152, accompanied by decrease in thickness of Si film 141 as shown in FIG. 1D. The resulting Si film is designated by 141a.

In the following step, additional Al-Ge alloy film 151a is coated over the whole surface under the above-stated conditions by sputtering, as shown in FIG. 1E. Owing to the good wettability of the Al-Ge-Si alloy film 152 when in contact with Al-Ge alloy, the formed Al-Ge alloy film 151a is substantially flat. The combined thickness of these Al-Ge alloy films is about 1 μm. Under the conditions, the alloying reaction proceeds to form Al-Ge-Si alloy film 152a having a flat surface, as shown in FIG. 1F, and in turn the insides of contact holes 131a, 131b, 132a, 132b are fully filled with Al-Ge-Si alloy film 152a. Besides in this stage, Si film 141a disappears. Once the reflowed Al-Ge alloy film is totally converted into Al-Ge-Si film under alloying reaction while within this substrate temperature range, the reflowing ceases. At temperatures of substrate higher than 450° C. the formed Al-Ge-Si alloy film becomes reflowed, too.

In the next step, Al-Ge-Si alloy film 152a is etched for patterning it, leaving Al-Ge-Si film parts 152aa, 152ab, 152ac, 152ad as shown in FIG. 1G. These Al-Ge-Si alloy film parts are conductor layers filling contact holes 131a, 131b, 132a, 132b, and concurrently Al-system interconnect parts connected to p-well 103 through p+-diffusion layer 111b and 112a, respectively, and to n-well 102 through n+-diffusion layers 111a and 112b, respectively. Al-Ge-Si alloy film 152a is etched by dry etching with a mixed gas of BCl3 and Cl2 using a photoresist film (not shown) as a mask, and the ashing of photoresist film is done by dry etching using a mixed gas of CH3OH and O2. The chloride produced during dry etching is removed during the ashing. Finally annealing is carried out in an atmosphere of H2 at about 400° C.

Furthermore after Al-Ge-Si alloy film 152a is etched back, leaving the part of it only in the insides of contact holes 131a, 131b, 132a, 132b, an Al-Cu-Si alloy film is formed over the whole surface, for example, to a thickness of about 1 μm and patterned to form an Al-involved interconnection layer.

The technique of sputtering Al-Ge-Si film without forming Si film 141 may be considered. In this case, the interlayer dielectric film 121 which is a major underlying film is inferior in wettability when in contact with Al-Ge-Si alloy film, and hence it is tend to become island-like Al-Ge-Si alloy films, even if reflowed. It therefore is difficult for technique like this to fully fill contact holes.

When the temperature of the Si substrate to be kept (substrate temperature) is high, the alloying reaction between Al-Ge alloy film and Si film is rapid, and vice versa. It therefore is desired to make the growth rate of Al-Ge alloy film at lower substrate temperature lower than that at higher substrate temperatures. At too high substrate temperatures, Al-Ge alloy film makes more remarkably the alloying reaction than the reflow, and consequently island-like Al-Ge-Si alloy films are formed. The experimental results revealed that the upper limit of substrate temperature for forming good Al-Ge-Si alloy film was about 450° C.

Besides the basic distinction between the present invention and the description in the aforesaid Japanese Published Patent Specification No. Sho. 54-41871 (Dec. 11, 1979) resides in whether Al alloy film is formed by the alloying reaction between the Si film and an Al alloy film formed on it alone or in combination with reflow phenomenon.

Figure 2:
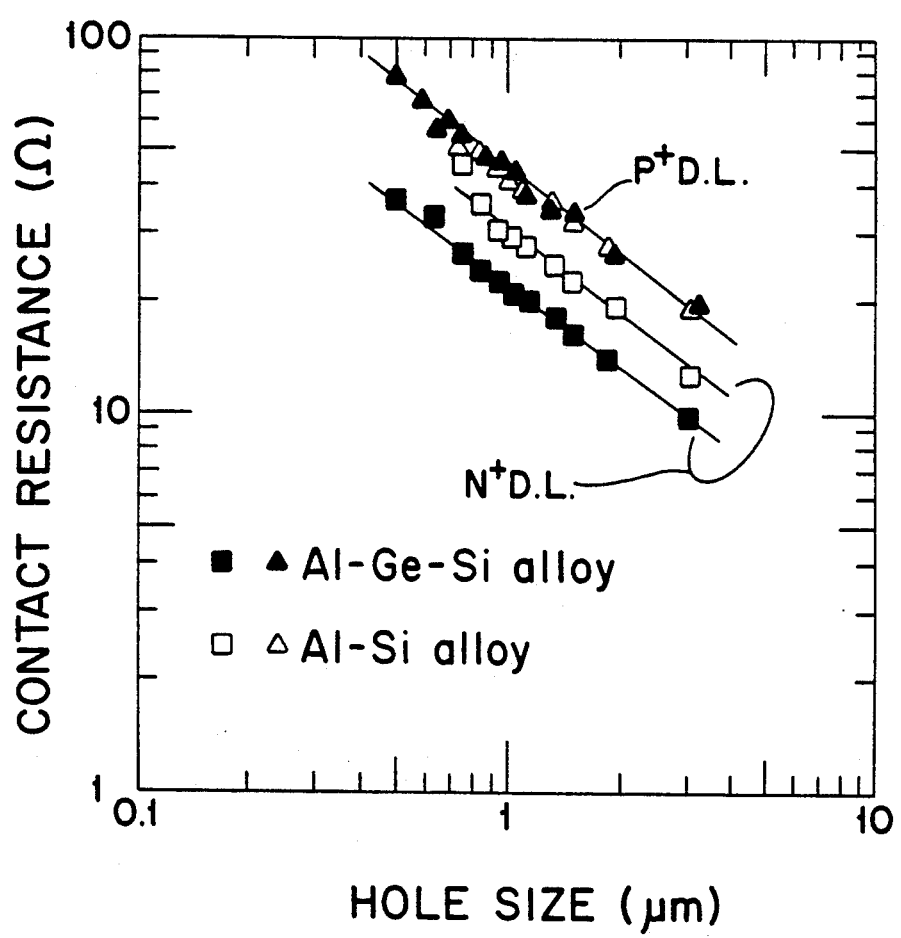
FIG. 2 is a graph showing the effect of the first embodiment by plotting contact resistance value against diameter (size) of the contact hole.

To verify the effect of the first embodiment above-described, in the same way as the first embodiment, contact holes 131a, 131b, 132a, 132b are formed. Al-Si alloy film is sputtered over the whole surface followed by patterning it, and thus a sample of a conventional structure was made. Firstly comparison of the value of contact resistance to diameter of contact hole, with reference to FIG. 2, reveals that there is little difference with p+-duffusion layer 111a as p+ D. L. indicates in the Figure, from the conventional structure. With n+-diffusion layer 112a, the contact resistance is lower in this embodiment than in the conventional structure as n+-diffusion layer 112a indicates in the Figure. For example, the contact resistance to p+-diffusion layer 111a was yielded by measuring the resistance between the interconnection consisting of about $10^3$ Al-involved connection filling contact hole 132a of 3.0 μm in diameter (Al-Ge-Si alloy film 152ad in this embodiment) parallel interconnected and effects of reducing the influence of the contact resistance on the n+-diffusion layer 112b, and the connection to p+-diffusion layer 111a (Al-Ge-Si alloy film 152ac in this embodiment).

Figure 3A:
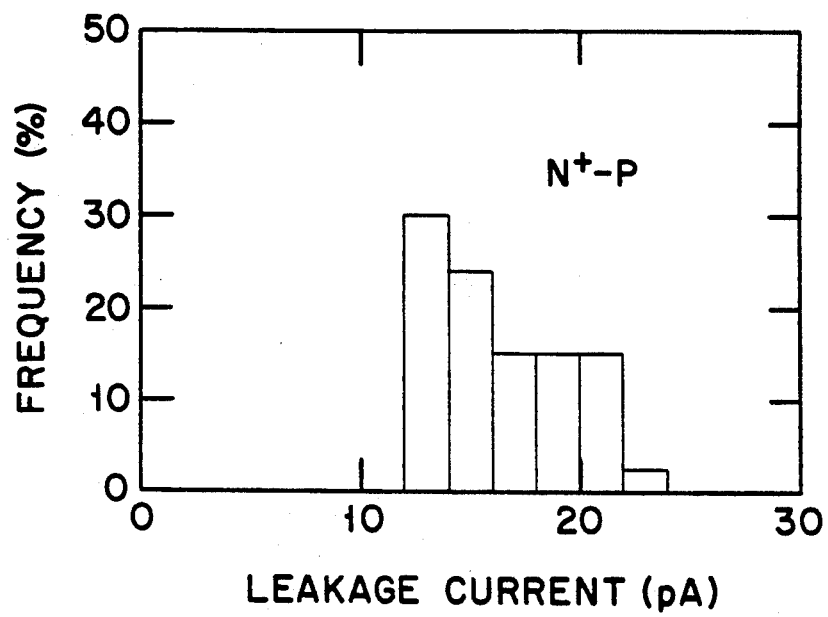
FIGS. 3A and 3B are column graphs of frequency against leakage current for making the effect of the first embodiment apparent.
Figure 3B:
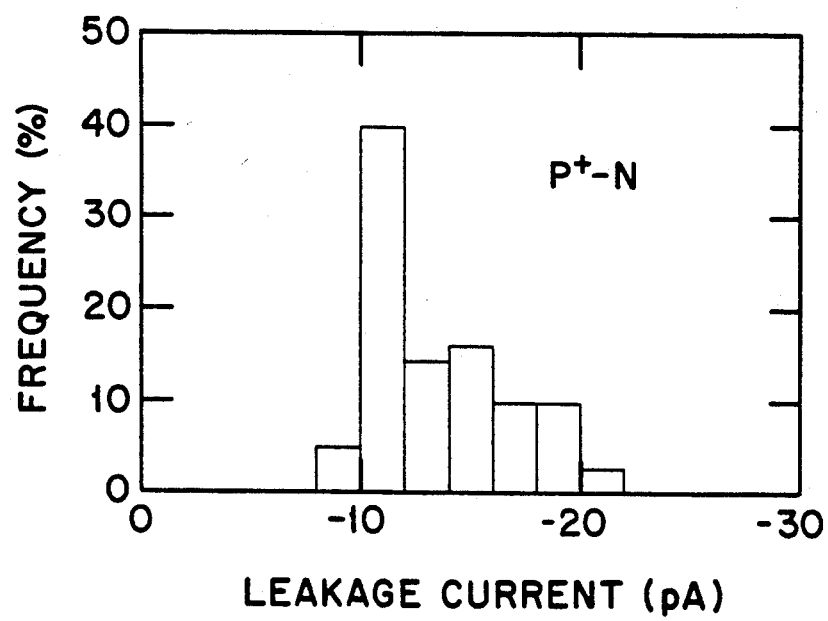

Referring to FIG. 3A showing the relationship of frequency against leakage current through n+-p junction, leakage currents in this embodiment were smaller than 30 pA. Leakage currents (not shown) in the conventional structure was dispersed widely beyond 30 pA. These were measured by applying +10 V to Al-Ge-Si alloy film 152ab consisting of $10^4$ square contact holes 131b of 0.8 μm in diameter parallel interconnected, with Al-Ge-Si alloy film 152aa grounded. Similarly referring to FIG. 3B showing the relationship of frequency against leakage current through n+-p junction, leakage currents in this embodiment were greater than −30 pA. Leakage currents (not shown) in the conventional structure was dispersed widely below 30 pA. These were likewise measured by applying −10 V to Al-Ge-Si alloy film 152aa consisting of $10^4$ square contact holes 131a of 0.8 μm in diameter parallel interconnected, with Al-Ge-Si alloy film 152ad grounded. As apparent from the above results, this embodiment has effect particularly on leakage current through p-n junction.

Figure 4A:
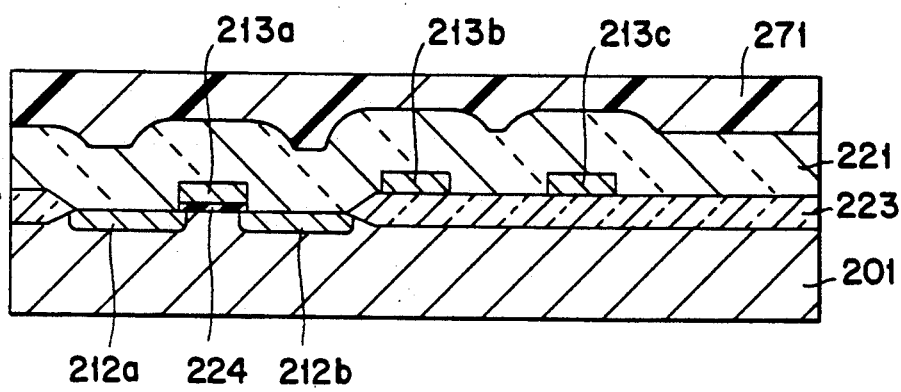
FIGS. 4A to 4E are fragmentary sectional views showing in sequence the process steps for illustrating the second embodiment of the present invention.

Referring to FIGS. 4A to 4E showing a process of fabricating a semiconductor device containing n-channel MOS transistors and two Al-alloy interconnection layer, the second embodiment of the present invention is fabricated as follows: Firstly a field oxide film 223 of about 0.5 μm in thick and a gate insulating film 224 of about 15 nm in thick are formed on the surface of p-type Si substrate 201. Then polycide interconnections 213a, 213b, 213c of 0.2 μm thick consisting of the upper layer of WSi2 film and the lower layer of n+-type polycrystalline silicon film is formed. Polycide interconnect 213a serves concurrently as an electrode. The level difference between polycide interconnects 213b, 213c on field oxide film 223 and polycide interconnect 213a is about 0.25 μm. Then n+ diffusion layers 212a, 212b are formed by As-ion implantation. The level difference between polycide interconnects 213b, 213c on field oxide film 223 and n+ diffusion layers 212a, 212b is about 0.45 μm. Then over the whole surface is formed the first interlayer film 221 of SiO$_2$ having a thickness of 1 μm by CVD technique with tetraethylorthosilicate: Si (OC$_2$H$_5$)$_4$, TEOS. Further over this whole surface, a photoresist film 271 is formed (FIG. 4A).

Figure 4B:
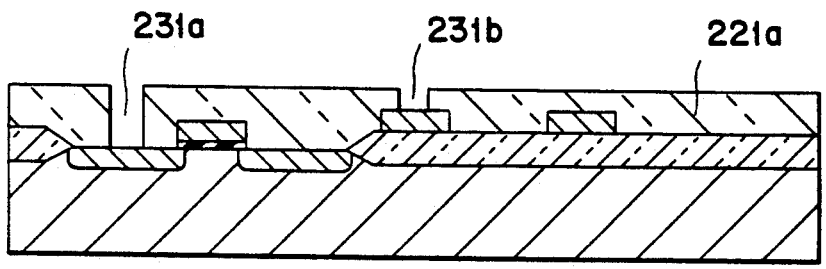

In the next step, photoresist film 271 is entirely removed, and etch back is carried out by dry etching using CHF$_3$ and O$_2$ until interlayer dielectric film 221 on n+ diffusion layers 212a, 212b is etched off to a thickness of about 0.25 μm, thus an interlayer dielectric film 221a being formed. The thickness of interlayer dielectric film 221a on n+ diffusion layer 212a, 212b is about 0.75 μm and that on polycide lines 212b, 213c is about 0.3 μm. Then contact holes 231a, 231b of 0.5 μm across extending to n+ diffusion 212a and polycideline 213b, respectively, are formed in interlayer dielectric film 221a. Contact holes 231a, 231b have aspect ratios of 1.5 and 0.6, respectively (FIG. 4B).

Figure 4C:
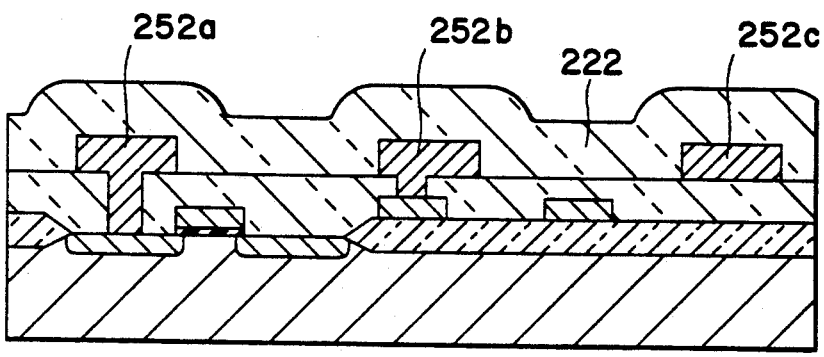

In the next step, in the same way as in the first embodiment, after a Si film (not shown) is formed over the whole surface, Al-Ge alloy film (not shown) of 0.5 μm thick, for example, under conditions of substrate temperature 400° C. and growth rate about 0.1 μm/min is formed, reflowed, and performs alloying reaction with the Si film, thus an Al-Ge-Si alloy film (not shown) of about 0.5 μm thick being formed. At this stage, contact holes 231a, 231b are entirely filled with Al-Ge-Si alloy film. This technique enables to easily fill contact holes of different aspect ratios with conductor. The Al-Ge-Si alloy film is patterned in a way similar to that of the first embodiment to form Al-Ge-Si alloy films 252a, 252b, 252c of Al alloy connection layers in the first layer. Al-Ge-Si alloy film 252a fills contact hole 231a and serves as Al alloy connection layer connected to n+ diffusion layer 212a, Al-Ge-Si alloy film 252b fills contact hole 231b and serves as Al alloy connection layer of the first layer connected to polycide connection layer 213b. Then the second interlayer dielectric film 222 of SiO$_2$ having about 0.8 μm thick is formed (FIG. 4C).

Figure 4D:
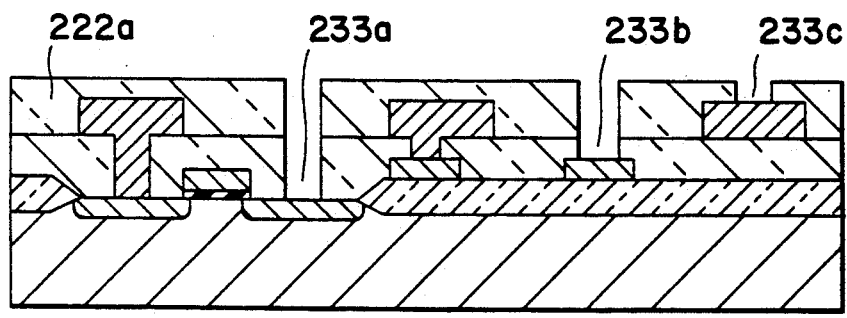

In the next step, after forming a photoresist film over the whole surface, etch back is carried out in the above-stated technique until the photoresist film is entirely etched off, thus an interlayer dielectric film 222a with the top face planarized being formed. The combined thickness of interlayer dielectric film 221 on n+ diffusion layer 212b and interlayer dielectric film 222a is about 1.75 μm, the combined thickness of interlayer dielectric layer 221a on polycide line 213a is 1.3 μm, and the thickness of interlayer dielectric film 222a on Al-Ge-Si alloy film 252c is 0.3 μm. Then contact hole 233a extending to n+ diffusion 212b and contact hole 233b extending to polycide line 213c, respectively, are formed by etching interlayer dielectric films 222a, 221a. Contact holes 233a, 233b, 233c have aspect ratios of 3.5, 1.6 and 0.6, respectively (FIG. 4D).

Figure 4E:
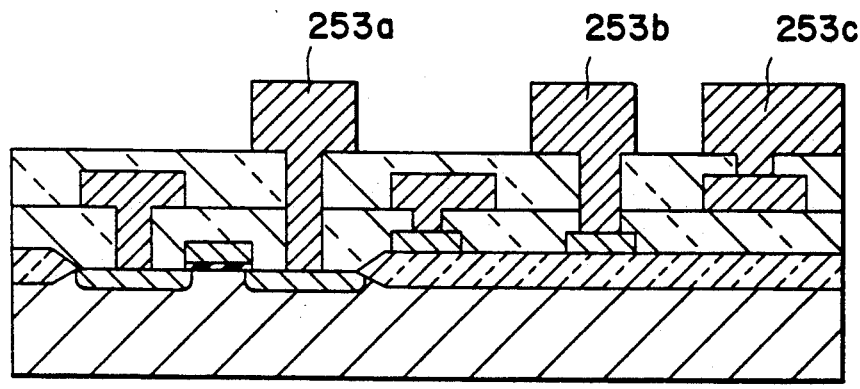

In the next step, Al-Ge-Si alloy film 253a, 253b, 253c of the second Al-involved interconnection layer having 0.5 μm thick are formed in similar fabrication way. During the process of forming this second Al-involved interconnection layer, Al-Ge alloy film is caused to reflow while Al-Ge-Si alloy film 252a, 252b, 252c of the first Al-involved interconnection layer are never reflowed. Al-Ge-Si alloy film 253a fills contact hole 233a and serves as the second Al alloy connection layer connected to n+ diffusion layer 212b, Al-Ge-Si alloy film 253b fills contact hole 233b and serves as the second Al alloy connection layer connected to polycide connection layer 213c. Al-Ge-Si alloy film 253c fills contact hole 233c and serves as the second Al alloy connection layer connected to Al-Ge-Si alloy film 252c. Finally anneal is carried out in a atmosphere of about 400° C. H$_2$ (FIG. 4E).

This embodiment has the effect that has been shown in the first embodiment. Further distinguished from the process described in the aforesaid paper: F. S. Chen, et al., Tech. Digest of IEDM, pp. 51-54, 1990, in this embodiment it is possible to form the upper Al alloy connection layer by a similar technique to that for forming the lower Al alloy connection layer. Besides this embodiment enables in a semiconductor device of multilayer Al-involved interconnection structure to directly connect an upper Al-involved interconnection layer to a lower interconnection layer including diffusion layers (and also the lower Al-involved interconnection layer) without intermediation of the lower Al-involved interconnection layer. This embodiment therefore enables to reduce area required for interconnection between the upper and lower Al-involved interconnection layers.

In these first and second embodiments, it was possible to form Al-involved interconnection layers and conductor layer filling contact holes with the same material by means of planarizing the top face of the interlayer dielectric film. It is needed for stagged-type DRAM (dynamic dram), EPROM (Erasable and programmable ROM) or EPROM (Electrically erasable and Programmable ROM) to make the interlayer dielectric film sufficiently thick for planarizing the top face of the interlayer dielectric film and then forming bit contact holes (it may be node contact holes for DRAM). For this reason, it is preferred for these semiconductor devices to apply the present invention to the formation of the conductor layer to fill contact holes while the top face of the interlayer dielectric film remains rough.

Figure 5:
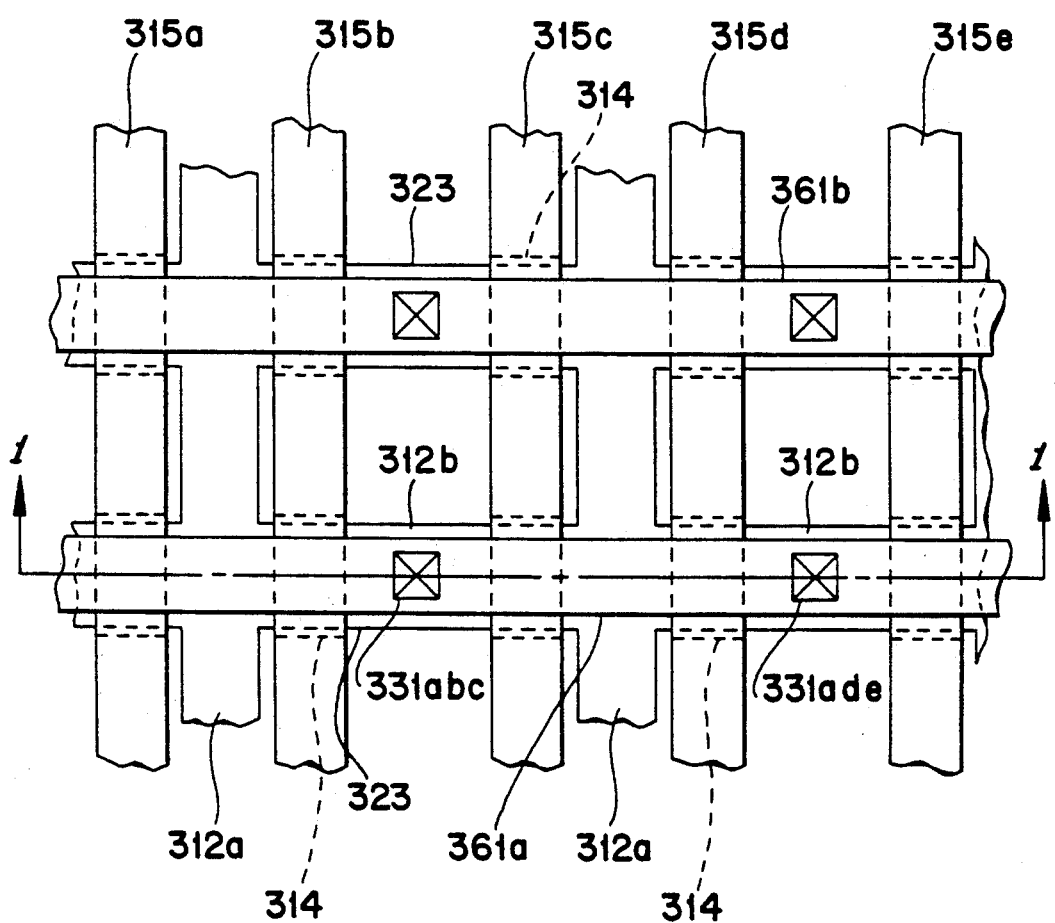
FIG. 5 is a fragmentary plan view of an EPROM illustrating the third embodiment of the present invention.
Figure 6A:
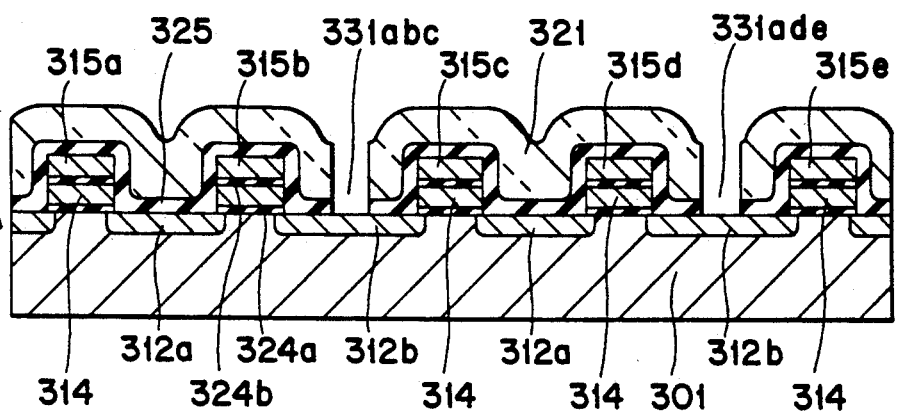
FIGS. 6A to 6C are fragmentary sectional views along line 1—1 of FIG. 5 for illustrating the third embodiment in sequence of the fabrication process.

Referring to FIG. 5, a fragmentary plan of an EPROM and FIGS. 6A to 6C, fragmentary sections along line 1—1 of FIG. 5 and illustrating in sequence the process steps of fabricating the EPROM, the third embodiment of the present invention will be described below: Firstly a field oxide film 323 (FIG. 5) of 0.5 μm thick and the first gate dielectric film 324 are formed on the surface of a p-type Si substrate 301. Then the first n+ type polycrystalline Si film of 0.3 μm thick, the second gate dielectric film on the surface of the first polycrystalline silicon film, and further over the whole surface the second n+ type polycrystalline Si film of about 0.3 μm are formed one after another. Then the second polycrystalline silicon film, the second gate dielectric film, the first polycrystalline silicon film, and the first gate dielectric film are sequentially etched to form the second polycrystalline silicon films 315a, 315b, 315c, 315d, 315e each as a control gate electrode and concurrently word line, the second gate dielectric film 324b, the first polycrystalline silicon film 314 as a floating gate electrode, and the first gate dielectric film 324a. Using polycrystalline silicon films 315a, 315b, 315c, 315d, 315e and polycrystalline silicon film 314 as masks, As ion implantation is carried out to form n+ diffusion layer 312a, 312b so that the junction depth is about 0.1 μm. n+ diffusion layers 312a, 312b serves as source and drain regions, respectively. After forming dielectric film 325 of 50 to 200 nm thick over the whole surface, interlayer film of BPSG having a thickness of about 0.5 µm is formed, for example, by CVD technique. Dielectric film 325 serves as a barrier for preventing P or B from diffusing from interlayer dielectric film 321 to n+ diffusion layers 312a, 312b. Then contact holes 331abc, 331ade are extending to n+ diffusion layer through the interlayer dielectric film 321 and dielectric film 325 at recesses in interlayer dielectric film 321 (FIGS. 5 and 6A).

Figure 6B:
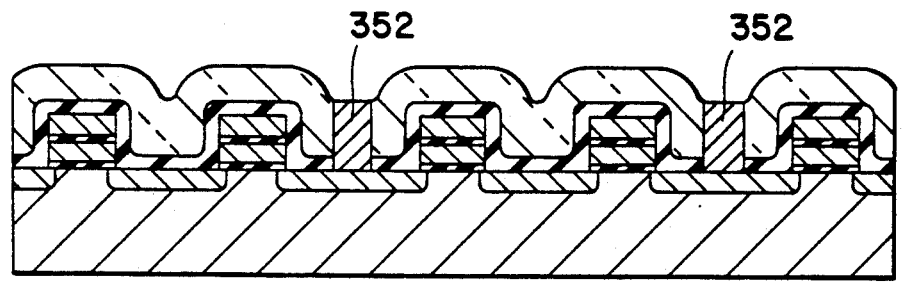
Figure 6C:
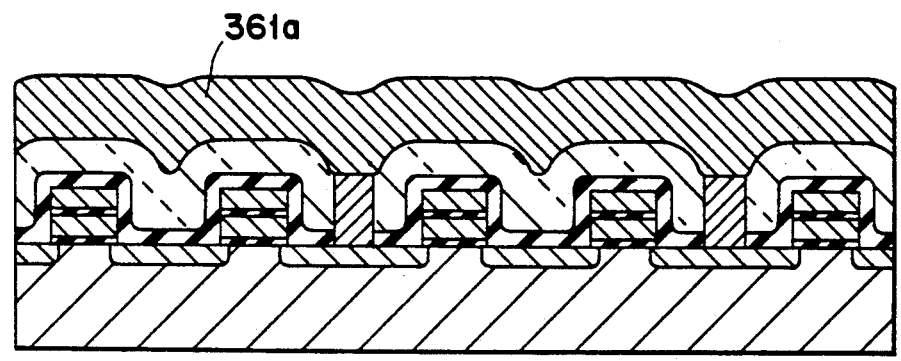

In the next step, an Al-Ge-Si alloy film is formed over the whole surface in the same way as in the first embodiment, and then etched back to form Al-Ge-Si alloy films 352 as conductor layers filling the insides of contact holes 331abc, 331ade (FIGS. 5 and 6B). If contact holes are to be formed at rises, and recesses as desired, in the interlayer dielectric film, as different from the present embodiment, it is needed to suitably combine etching using a photoresist film as mask and etching back.

In the next step, an Al-Ge-Si alloy film (not shown) of about 0.1 µm thick are sputtered over the whole surface, and patterned by dry etching with a mixed gas of $BCl_3$ and $Cl_2$ using a photoresist film (not shown) as mask to form Al-Cu-S alloy films 361a, 361b as the first Al-involved interconnection layer and concurrently bit lines. Ashing of photoresist film using a mixed gas of $CH_3OH$ and $O_2$ follows. Finally an anneal is carried out in an about 400° C. atmosphere (FIGS. 5 and 6C).

The present embodiment has the same effects as the first embodiment has. Further the present embodiment can be applied to smaller contact hole diameter than that in the first embodiment, too. Application of this embodiment to multilayer Al-involved interconnection structure easily enables the thickness of an interlayer dielectric film between interconnection layers to be greater than that in the second embodiment, and hence to reduce the parasitic capacity between Al-involved interconnection layers compared with the second embodiment.

Figure 7A:
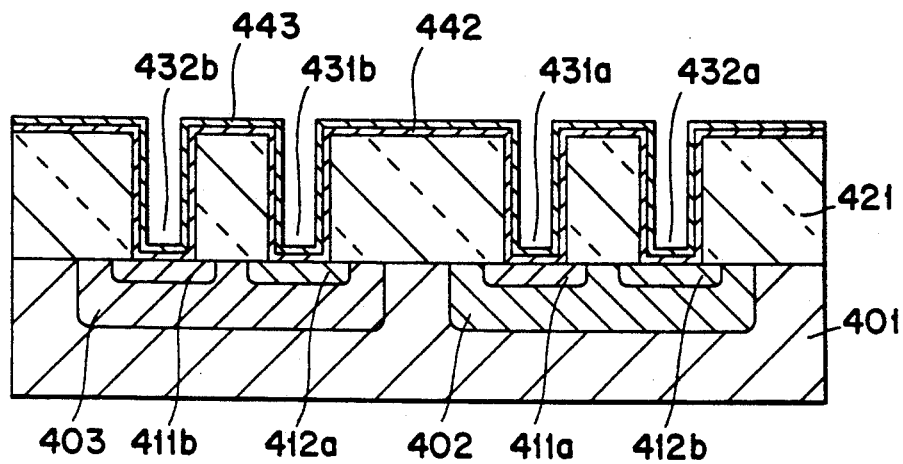
FIGS. 7A to 7C are fragmentary sectional views showing in sequence the process steps for illustrating the fourth embodiment of the present invention.
Figure 7B:
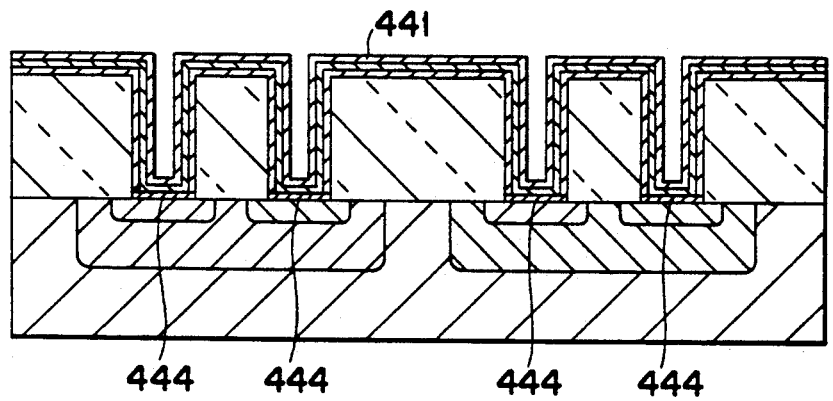
Figure 7C:
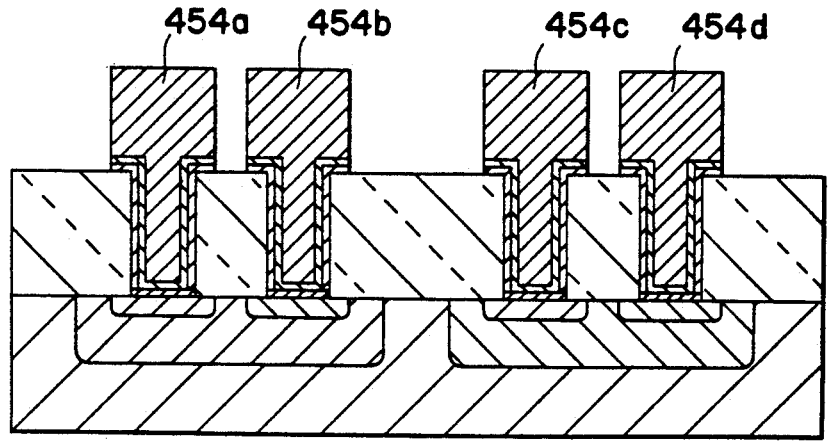

In the first, second and third embodiments of the present invention, a conductor layer filling contact holes and the lower interconnection layer are directly contacted to each other. In contrast to this, referring to FIGS. 7A to 7C illustrating a process of fabricating a semiconductor so constructed that an Al alloy interconnection layer is of a single layer, and a conductor layer filling a contact hole and the lower interconnection layer are connected through a conducting barrier film, the fourth embodiment of the present invention will be described under: Firstly in the same way as in the first embodiment described above, n-well 402 and p-well 403 are formed to create junctions of about 2 µm depth, respectively. Then p+ diffusion layer 411a and n+ diffusion layer 412b are formed on the surface of n-well 402 and n+ diffusion layer 412a and p+ diffusion layer 411b are formed on the surface of p-well 403. The junction depths of p+ diffusion layers 411a, 411b and n+ diffusion layer 412a, 412b are both about 0.5 µm. Then over the whole surface, interlayer dielectric film 421, about 1 µm thick, of $SiO_2$ is formed by CVD technique. The top face of interlayer dielectric film 421 is substantially flat. Then contact hole 431a extending to p+ diffusion layer 411a, contact hole 431b extending to n+ diffusion layer 412a, contact hole 432a extending to n+ diffusion layer 412b, and contact hole 432b extending to p+ diffusion layer 411b are all formed in interlayer dielectric film 421. Each has a diameter of 0.5 µm and a aspect ration of 2.0. Over the entire surface a film 442 of about 50 nm thick is sputtered and over this whole film another TiN film 443 of about 50 nm thick at a substrate temperature of about 200° C. is sputtered. Thin film 442 serves for increasing adhesion between TiN film 443 and the lower interlayer dielectric film 421 (FIG. 7A).

In the next step, a lamp anneal is carried out in a $N_2$ atmosphere (620° C.) for 30 sec to allow the parts of Ti film 442 place in contact with p+ diffusion layer 411a, 411b, and n+ diffusion layers 412a, 412b to react, with the result of conversion into $TiS_2$ films 444. This reaction is done for making the contact resistance stable at a low value. When the Ti film is remained as it is, contact resistance varies. Then in a way similar to that of the first embodiment, Si film 441 of about 5 to 50 nm thick is formed over the whole surface by sputtering (FIG. 7B).

In the next step, under the same conditions as those of sputtering of Al-Ge alloy film in the first embodiment, sputtering is carried out to form an Al-Ge-Cu alloy film of 1 µm thick containing Ge 1% by weight and Cu 0.5% by weight, and then an Al-Ge-Cu-Si alloy film of 1 µm thick is formed by reflow and alloying reaction. In a similar way to that in the first embodiment, this Al-Ge-Cu-Si alloy film is patterned to form Al-Ge-Cu-Si alloy films 454a, 454b, 454c, 454d. Ti film 441 and TiN film 443 are removed by etching this alloy film. Al-Ge-Cu-Si alloy film 454a is a conductor layer filling contact hole 432b, and concurrently serves as an Al alloy connection to p-well 403 through p+ diffusion 411b. Similarly Al-Ge-Cu-Si alloy film 454b is a conductor layer filling contact hole 431b and concurrently serves as an Al alloy connection to n+ diffusion 412a. Al-Ge-Cu-Si alloy film 454c is a conductor layer filling contact hole 431a and concurrently serves as an Al alloy connection to p+ diffusion 411a. Al-Ge-Cu-Si alloy film 454d is a conductor layer filling contact hole 432a, and concurrently serves as an Al alloy connection to p-well 402 through n+ diffusion 412b. Finally an anneal is carried out in an about 400° C. $H_2$-atmosphere (FIG. 7C).

Instead the Al-Ge-Cu-Si alloy film may be etched back to leave it only inside contact holes 431a, 431b, 432a, 432b, and then for example, an Al-Cu-Si alloy film of about 1 µm thick is formed over the whole surface, and patterned to form Al alloy interconnection layer.

This embodiment has the same effect as, and is superior to, the above described first embodiment, in the respect of, owing to be provided with barrier films, preventing separation of Si (one type of solid-phase epitaxial growth) from this conductor layer, which trends to produce when Al alloy film is used as a conductor layer filling contact holes. Furthermore this embodiment is, because of Al alloy film containing Cu used in it, superior to the first embodiment in prevention of electromigration effect. Al-Ge-Cu-Si alloy film can be used in place of Al-Ge-Si in the first embodiment, too.

Instead of the laminated films of Ti film and TiN film used as barrier films in this embodiment, TiW film can be used. In this case however the contact resistance to p+ diffusion layer has an about 3-time higher value.

The use of the laminated film of Ti film and TiN film as a barrier film required thermal treatment at about 620° C., and hence it cannot be applied to two or more-layer interconnection structure. In this case, it is preferred to previously form a conducting barrier film on the surface of the diffusion layer. A silicide film is formed on the surface of a diffusion layer in self-aligned way by exposing the surface of the diffusion layer, forming a Ti film over the whole surface, and performing thermal treatment in an inert atmosphere, thus a TiS$_2$ film being formed on the diffusion layer. This is called self-aligned silicide structure.

Figure 8:
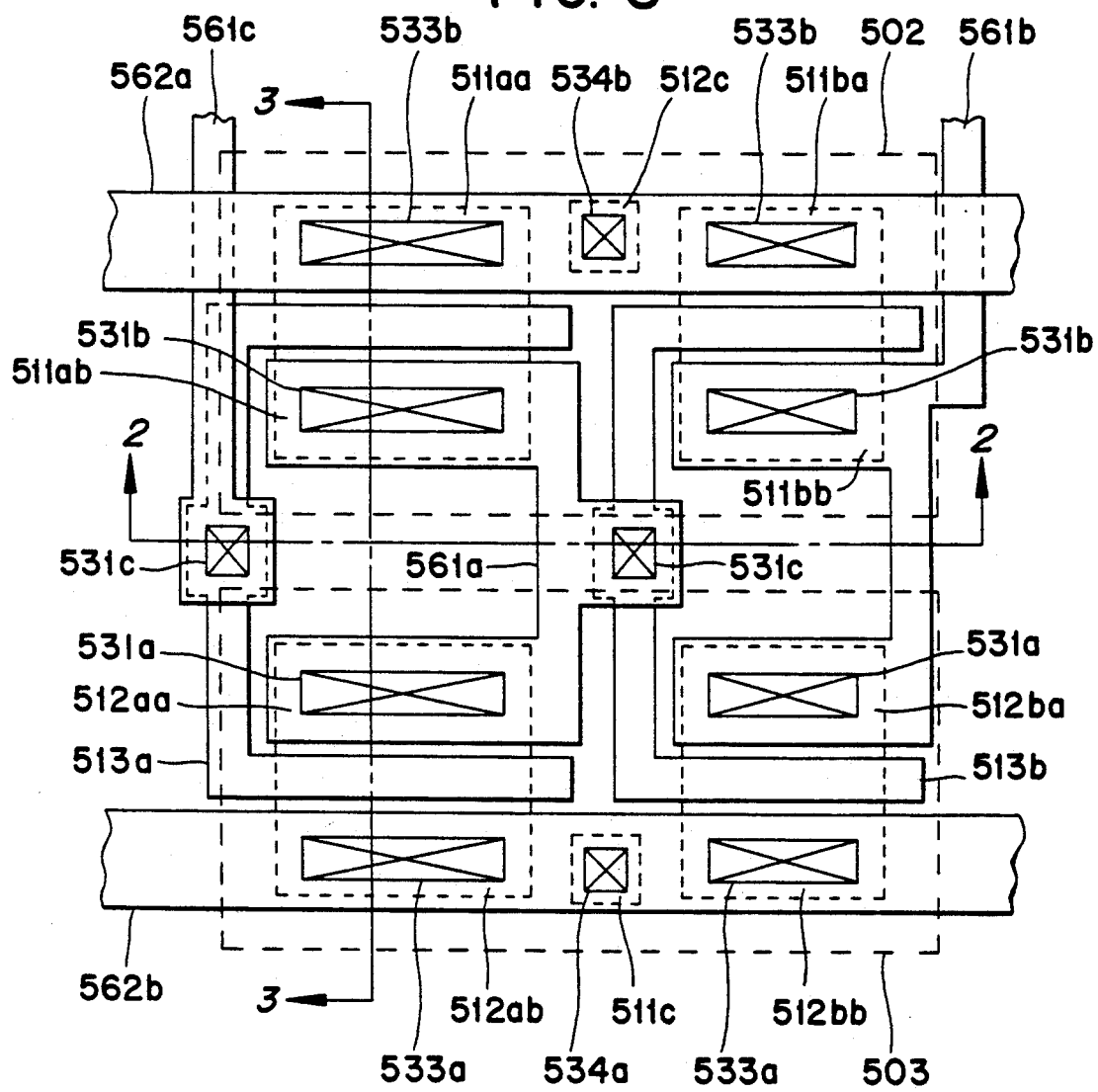
FIG. 8 is a fragmentary plan view of a CMOS two-step inverter for illustrating the fifth embodiment of the present invention.

Referring to FIG. 8 of a fragmentary plan of two-stage CMOS inverter (buffer circuit) of two-layer Al alloy interconnection structure having silicide-structure diffusion layers, and to FIGS. 9A and 9B and 10A to 10C of fragmentary sections illustrating sequentially the process steps of fabricating the inverter along lines 2—2 and 3—3, respectively, the fifth embodiment of the present invention will be described below: Firstly n-well 503 and p-well 503 of about 2 μm in junction depth are formed at the surface of a p-type Si substrate 501. On the surface of p-type Si substrate 501 field oxide film 523 of about 0.5 μm thick and a gate dielectric film 524 of about 15 nm thick are formed. Then an about 0.2 μm thick polycide connections 513a, 513b consisting of the upper layer of WSi$_2$ film and the lower layer of n+-type polycrystalline Si film. Polycide connection 513a concurrently serves as the gate electrode of the first-stage CMOS inverter, and polycide connection 513b concurrently serves as the gate electrode of the second-stage CMOS inverter. Then As ion implantation is carried out to form n+ diffusion layers 512aa, 512ab, 512bb on the surface of p-well 503, and n+ diffusion layer 512c on the surface of n-well 502. Before and after formation of these n+ diffusion layers, BF$_2$ ion implantation is carried out to form p+ diffusion layers 511aa, 511ab, 511ba, 511bb on the surface of n-well 502 and p+ diffusion layer 511c on the surface of p-well 503. Then over the whole surface a SiO$_2$ dielectric film of about 100 nm thick is formed, and etched back leaving dielectric films 525 on the side faces of polycide connections 513a, 513b.

In the next step, a Ti film of about 50 nm thick is formed over the whole surface and subjected to lamp anneal in an about 600° C. Ar atmosphere to react into the silicide, thus TiSi$_2$ film 545 is formed on the surfaces of p+ diffusion layers 511aa, 511ab, 511ba, 511bb, 511c and on the surfaces of n+ diffusion layers 512aa, 512ab, 512ba, 512bb, 512c, respectively, and unreacted Ti film is etched away. In this case no TiSi$_2$ film is formed on the surfaces of polycide connections 513a, 513b.

Figure 9A:
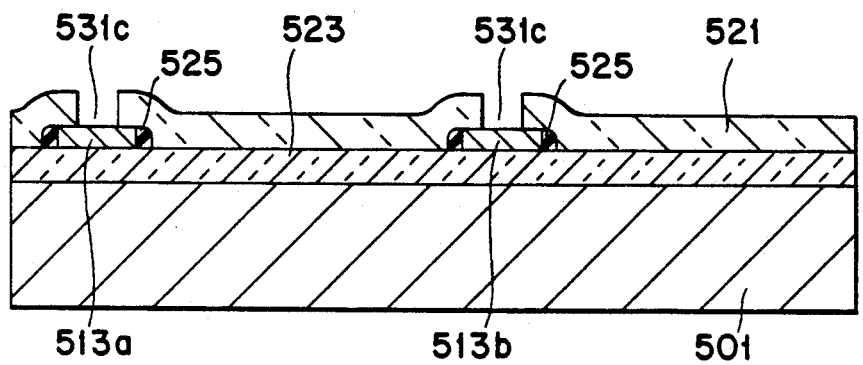
FIGS. 9A and 9B are fragmentary sectional views along line 2—2 of FIG. 8 for illustrating the fifth embodiment in sequence of the fabrication process.
Figure 10A:
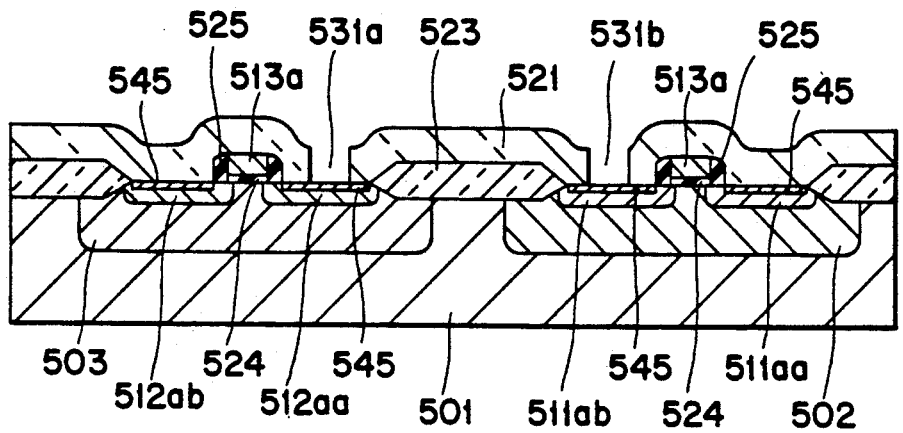
FIGS. 10A to 10C are fragmentary sectional views along line 3—3 of FIG. 8 for illustrating the fifth embodiment in sequence of the fabrication process.

In the next step, the first interlayer dielectric film 521 of SiO$_2$, about 0.5 μm thick, is formed over the whole surface by CVD technique using TEOS and O$_3$. Then contact holes 531a extending to n+ diffusion layers 512aa, 512ab, respectively, and contact holes 531c reaching polycide connections 513a, 513b, respectively, are formed in interlayer dielectric film 521 (FIGS. 1, 9A and 10A).

In the next step, Al-Ge-Cu-Si films 554a filling contact holes 531a, 531b, 531c are formed. A TiW film 546a of about 100 nm thick, an Al-Ge-Cu-Si alloy film of about 1 μm thick, and a TiN film 543a of about 100 nm are sequentially sputtered over the whole surface. TiN film 543a, Al-Cu-Si alloy film and TiW film 546a are sequentially etched to form Al-Cu-Si alloy films 561a, 561b, 561c as the first Al-involved interconnection layers. Al-Cu-Si alloy film 561a interconnects among p+ diffusion layer 511ab, n+ diffusion layer 512aa and polycide connection 513b. Al-Cu-Si alloy film 561b serving as an output signal line interconnects p+ diffusion layer 511bb and n+ diffusion layer 512ba. Al-Cu-Si alloy film 561c serving as an input signal line is connected to polycide connection 513a.

Figure 9B:
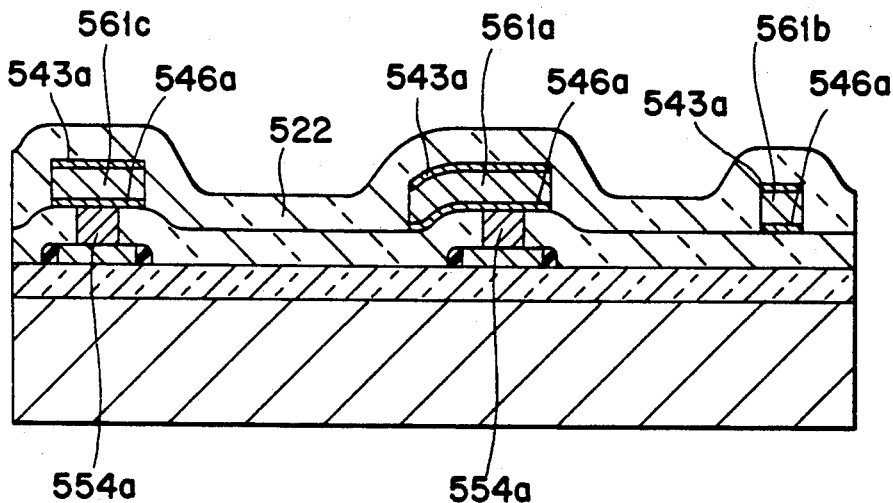
Figure 10B:
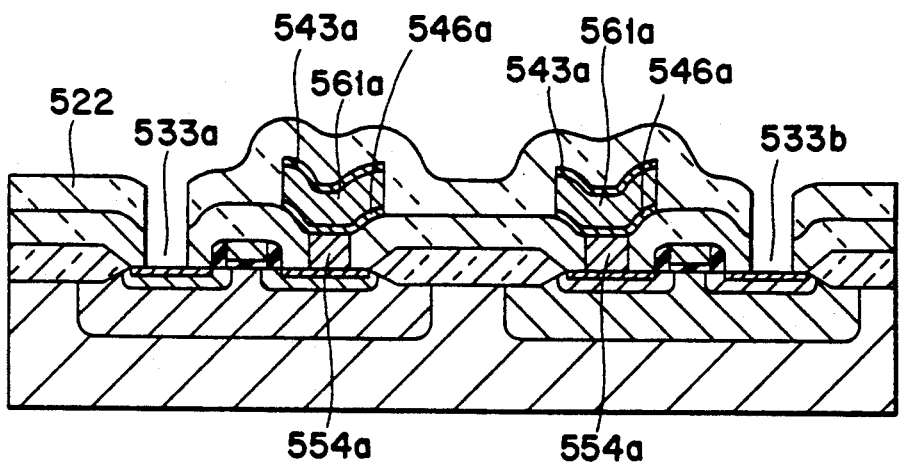

In the next step, the first interlayer dielectric film 522 of SiO$_2$, about 0.5 μm thick, is formed over the whole surface by CVD technique using TEOS and O$_3$. Then contact holes 533a extending to n+ diffusion layers 512ab, 512bb, respectively, and contact holes 533b extending to p+ diffusion layers 511aa, 511ba, respectively, a contact hole 534a extending to p+ diffusion layer 511c, a contact hole 534b extending to n+ diffusion layer 512c are formed in interlayer dielectric layers 522, 521. Furthermore the process in this embodiment comprises no formation of contact holes in the first Al-involved interconnection layer. In the case of forming such a contact hole, TiN film 543a at the top face of the first Al-involved interconnection layer or at the lower end of the contact hole is etched away. (FIGS. 8, 9B, and 10B)

Figure 10C:
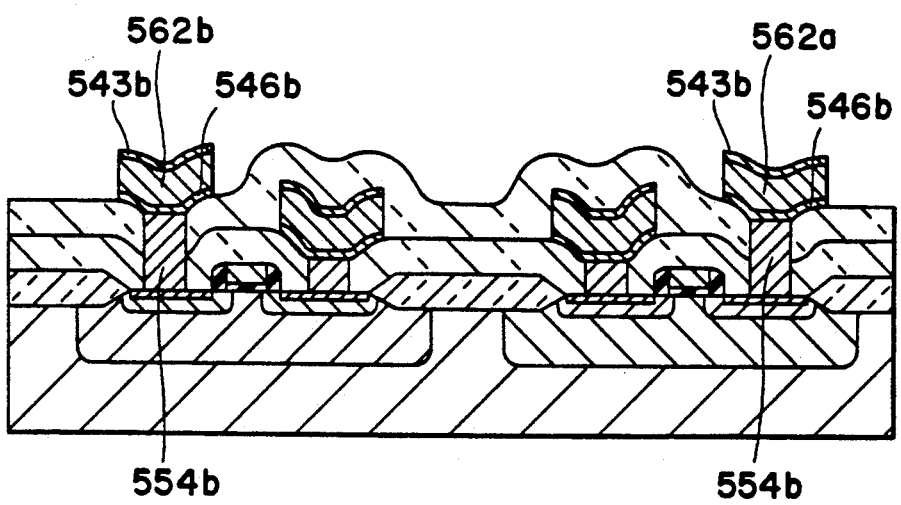

In the next step, Al-Ge-Cu-Si film 554b filling contact holes 533a, 533b, are formed. A TiW film 546b of about 100 nm thick, an Al-Cu-Si alloy film of about 1 μm thick, and a TiN film 543b of about 100 nm are sequentially sputtered over the whole surface. TiN film 543b, Al-Cu-Si alloy film and TiW film 546b are sequentially etched to form Al-Cu-Si alloy films 562a, 562b as the second Al-involved interconnection layers. Al-Cu-Si alloy film 562a serving as a power supply connection is connected to n-well 502 through p+ diffusion layer 511aa, p+ diffusion layer 511ba or n+ diffusion layer 512c. Al-Cu-Si alloy film 562b serving as a ground connection is connected to p-well 503 through n+ diffusion layer 512ab, n+ diffusion layer 512bb or p+ diffusion layer 511c. Finally an anneal is carried out in an about 400° C. H$_2$ atmosphere (FIGS. 8 and 10C).

This embodiment has respective effects of the first, second and third embodiments, and in addition, because of forming barrier films on the top and bottom faces of the Al-involved interconnection layer, is superior in stress migration resistance.

Furthermore in place of TiW film as a barrier film, a laminated film of Ti film and TiN film may be used in the same way as in the fourth embodiment. It also is possible to combine this embodiment and the structure and fabrication process of the fourth embodiment.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A semiconductor device, comprising: at least a lower interconnection layer containing diffusion layers formed at the surface of a Si substrate, an upper interconnection layer formed above said Si substrate through the intermediation of an interlayer dielectric layer, contact holes extending from said upper interconnection layer to said lower interconnection layer, and a conductor layer filling said contact holes, said upper interconnection layer consisting of an Al-involved interconnection layer, said conductor layer being made of an alloy consisting essentially of Al, Si and Ge, said alloy having a eutectic point lower than the eutectic point of Al-Si alloy.

2. A semiconductor device according to claim 1 wherein said Al-involved interconnection layer is made of an Al alloy having a eutectic point higher than the eutectic point of said Al alloy of which said conductor layer is made.

3. A semiconductor device according to claim 1, wherein the top face of said interlayer dielectric layer is substantially flat.

4. A semiconductor device according to claim 1, wherein said interlayer dielectric layer is substantially flat, and said Al-involved interconnection layer is made of said Al alloy of which said conductor layer is made.

5. A semiconductor device according to claim 1, wherein a conducting barrier film is provided at least in each region in the top face of said lower interconnection layer exposed through said contact holes.

6. A semiconductor device according to claim 5, wherein silicide layers are provided at least on the entire top faces of said diffusion layers.

7. A semiconductor device according to claim 6 wherein said barrier film is provided at least on the side faces of said interlayer dielectric layer exposed through said contact holes.

* * * * *